US010825661B2

(12) United States Patent
McChesney et al.

(10) Patent No.: US 10,825,661 B2
(45) Date of Patent: *Nov. 3, 2020

(54) SYSTEMS FOR COOLING RF HEATED CHAMBER COMPONENTS

(71) Applicant: Lam Research Corporation, Fremont, CA (US)

(72) Inventors: Jon McChesney, Fremont, CA (US); Saravanapriyan Sriraman, Fremont, CA (US); Richard A. Marsh, San Ramon, CA (US); Alexander Miller Paterson, San Jose, CA (US); John Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 171 days.

This patent is subject to a terminal disclaimer.

(21) Appl. No.: 15/969,583

(22) Filed: May 2, 2018

(65) Prior Publication Data

US 2018/0247796 A1    Aug. 30, 2018

Related U.S. Application Data

(63) Continuation of application No. 13/292,649, filed on Nov. 9, 2011, now Pat. No. 9,978,565.

(Continued)

(51) Int. Cl.
*H01J 37/32*        (2006.01)

(52) U.S. Cl.
CPC .. *H01J 37/32522* (2013.01); *H01J 37/32082* (2013.01); *H01J 37/32119* (2013.01); *H01J 37/32238* (2013.01)

(58) Field of Classification Search
CPC .......... H01J 37/32119; H01J 37/32082; H01J 37/32238; H01J 37/32522
See application file for complete search history.

(56) References Cited

U.S. PATENT DOCUMENTS

| 5,525,159 A | 6/1996 | Hama et al. |
| 5,690,050 A | 11/1997 | Doi |

(Continued)

FOREIGN PATENT DOCUMENTS

| CN | 101409227 | 4/2009 |
| EP | 0808917 | 11/1997 |

(Continued)

OTHER PUBLICATIONS

Office Action dated Feb. 11, 2016 from U.S. Appl. No. 13/851,793, filed Mar. 27, 2013.

(Continued)

*Primary Examiner* — Yuechuan Yu
(74) *Attorney, Agent, or Firm* — Beyer Law Group LLP

(57) ABSTRACT

In one embodiment, a plasma processing device may include a dielectric window, a vacuum chamber, an energy source, and at least one air amplifier. The dielectric window may include a plasma exposed surface and an air exposed surface. The vacuum chamber and the plasma exposed surface of the dielectric window can cooperate to enclose a plasma processing gas. The energy source can transmit electromagnetic energy through the dielectric window and form an elevated temperature region in the dielectric window. The at least one air amplifier can be in fluid communication with the dielectric window. The at least one air amplifier can operate at a back pressure of at least about 1 in-$H_2O$ and can provide at least about 30 cfm of air.

19 Claims, 5 Drawing Sheets

Related U.S. Application Data

(60) Provisional application No. 61/544,799, filed on Oct. 7, 2011.

(56) References Cited

U.S. PATENT DOCUMENTS

| | | |
|---|---|---|
| 5,863,376 A | 1/1999 | Wicker et al. |
| 5,944,899 A | 8/1999 | Guo et al. |
| 6,024,826 A | 2/2000 | Collins et al. |
| 6,059,922 A | 5/2000 | Yamazaki et al. |
| 6,189,484 B1 | 2/2001 | Yin et al. |
| 6,243,966 B1 | 6/2001 | Lubomirsky et al. |
| 6,280,563 B1 | 8/2001 | Baldwin, Jr. et al. |
| 6,326,597 B1 | 12/2001 | Lubomirsky et al. |
| 6,367,410 B1 | 4/2002 | Leahey et al. |
| 6,414,648 B1 | 7/2002 | Holland et al. |
| 7,140,321 B2 | 11/2006 | Nakayama et al. |
| 7,442,273 B2 | 10/2008 | Kwon et al. |
| 2004/0083971 A1 | 5/2004 | Holland et al. |
| 2004/0118520 A1 | 6/2004 | Nakayama et al. |
| 2008/0023147 A1* | 1/2008 | Yokogawa ........ H01J 37/32431 156/345.53 |
| 2009/0120066 A1 | 5/2009 | VanderGriend et al. |
| 2009/0184089 A1 | 7/2009 | Chebi et al. |
| 2009/0280235 A1 | 11/2009 | Lauerhaas et al. |
| 2011/0168673 A1 | 7/2011 | Nishimoto |

FOREIGN PATENT DOCUMENTS

| | | |
|---|---|---|
| KR | 2000/0016384 | 3/2000 |
| KR | 2004/0048838 | 6/2004 |
| KR | 2005/0008960 | 1/2005 |
| TW | 279240 | 6/1996 |
| TW | 447029 | 7/2015 |

OTHER PUBLICATIONS

Office Action in Taiwan Application No. 101136958 dated Feb. 24, 2015.

"Super Air Amplifier Specifications" http://www.exair.com/en-US/Primary%20Navigation/Products/Air%20Amplifiers/Pages/Super%20Air%20Amplifier.aspx?lab=Specs (accessed on Nov. 9, 2011—wayback machine internet archive date of Nov. 19, 2008).

"Air Amplifiers" http://www.exair.com/en-US/Primary%20Navigation/Products/Air%20.Amplifiers/Pages/A r%20Amplifiers%20How%2othey%20work.aspx (accessed on Nov. 9, 2011—wayback machine internet archive date of Nov. 14, 2008).

\* cited by examiner

SYSTEMS FOR COOLING RF HEATED CHAMBER COMPONENTS

CROSS-REFERENCE TO RELATED APPLICATIONS

This application is a Continuation of U.S. application Ser. No. 13/292,649 filed on Nov. 9, 2011 entitled "SYSTEMS FOR COOLING RF HEATED CHAMBER COMPONENTS" which claims the benefit of U.S. Provisional Application No. 61/544,799, filed Oct. 7, 2011, entitled "SYSTEMS FOR COOLING RF HEATED CHAMBER COMPONENTS." The foregoing applications are hereby incorporated by reference in their entireties.

TECHNICAL FIELD

The present specification generally relates to plasma processing devices comprising devices for cooling, more specifically, relates to plasma processing devices comprising devices for cooling a dielectric window.

BACKGROUND

Plasma processing devices can be utilized to etch material away from a substrate formed from, for example, a semiconductor or glass. Plasma processing devices may contain a vacuum chamber that encloses plasma processing gases, which can be ionized and transformed into plasma. For example an energized source (radio frequency (RF), microwave or other source) can apply energy to the process gas to generate the plasma. In some plasma processing devices, the energy can be transmitted through a dielectric window that is formed through the vacuum chamber. Accordingly, the dielectric window can be subjected to heating induced by the electromagnetic energy. Moreover, the heating can be localized to specific regions of the dielectric window due to variations in electromagnetic energy caused by process conditions. There can be two sources of heating of the dielectric window. First, the dielectric properties of the window (tangent-δ) may result in the direct absorption of RF or microwave power. Second, the plasma created by the energized source can indirectly heat the window. Moreover, the heating can be evenly distributed across the dielectric window or localized to specific regions of the window due to the design of the source (antenna construction, etc) and plasma conditions.

Heat energy can be removed from dielectric windows passively (i.e. no cooling device) or with a cooling device such as a liquid cooling system or a fan cooling system. Liquid cooling systems can be efficient but are more expensive than passive cooling or fan cooling systems. Moreover, liquid cooling systems are more difficult to implement in an environment subjected to electromagnetic energy. For example liquid cooling can cause localized cooling resulting in thermal gradients and thermal cracking. The dielectric properties for the liquid are different to the surrounding ceramic resulting in non-uniform transmission of the RF power. For example, the liquid may be conducting which would result in the dissipation of RF power within the liquid. The liquid may be subject to nucleation and can be difficult to contain within the cooling system.

Fan cooling systems can be utilized for cooling of dielectric windows such as, for example, via convection. However, fan cooling systems can be inefficient and difficult to apply to localized regions of relatively high heat load induced by the energized source in a dielectric window. Specifically, fan cooling systems suitable for use with plasma processing devices are ineffective for heat removal when subjected to high back pressure. For example, fan cooling systems may stall and fail to provide sufficient air flow for cooling when subjected to back pressures of about 0.5 in-$H_2O$ or more.

Accordingly, a need exists for alternative devices for cooling dielectric windows of plasma processing devices.

SUMMARY

In one embodiment, a plasma processing device may include a dielectric window, a vacuum chamber, an energized source, a plenum and at least one air amplifier. The dielectric window may include a plasma exposed surface and an air exposed surface. The vacuum chamber can be coupled with the dielectric window. The vacuum chamber and the plasma exposed surface of the dielectric window can cooperate to enclose a plasma processing gas. The energized source can be disposed inside or outside of the vacuum chamber. The energized source can transmit energy through the dielectric window and into the vacuum chamber. The electromagnetic energy can form an elevated temperature region in the dielectric window and can transform at least a portion of the plasma processing gas into plasma. The at least one air amplifier can be in fluid communication with the air exposed surface of the dielectric window. The at least one air amplifier can operate at a back pressure of at least about 1 in-$H_2O$ and can provide at least about 30 cfm of air.

In another embodiment, a plasma processing device may include a dielectric window, a vacuum chamber, an energy source, a plenum, and at least one air amplifier. The dielectric window may include a plasma exposed surface and an air exposed surface. The vacuum chamber can be coupled with the dielectric window. The vacuum chamber and the plasma exposed surface of the dielectric window can cooperate to enclose a plasma processing gas. The energy source can be disposed outside of the vacuum chamber. The energy source can transmit electromagnetic energy through the dielectric window and into the vacuum chamber such that the electromagnetic energy forms an elevated temperature region in the dielectric window to transform at least a portion of the plasma processing gas into a plasma. The plenum can be in fluid communication with the air exposed surface of the dielectric window. The plenum can be disposed over the elevated temperature region of the dielectric window. The at least one air amplifier can be in fluid communication with the plenum. The at least one air amplifier can pressurize the plenum to a back pressure of at least about 2 in-$H_2O$ and provides at least about 30 cfm of air.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
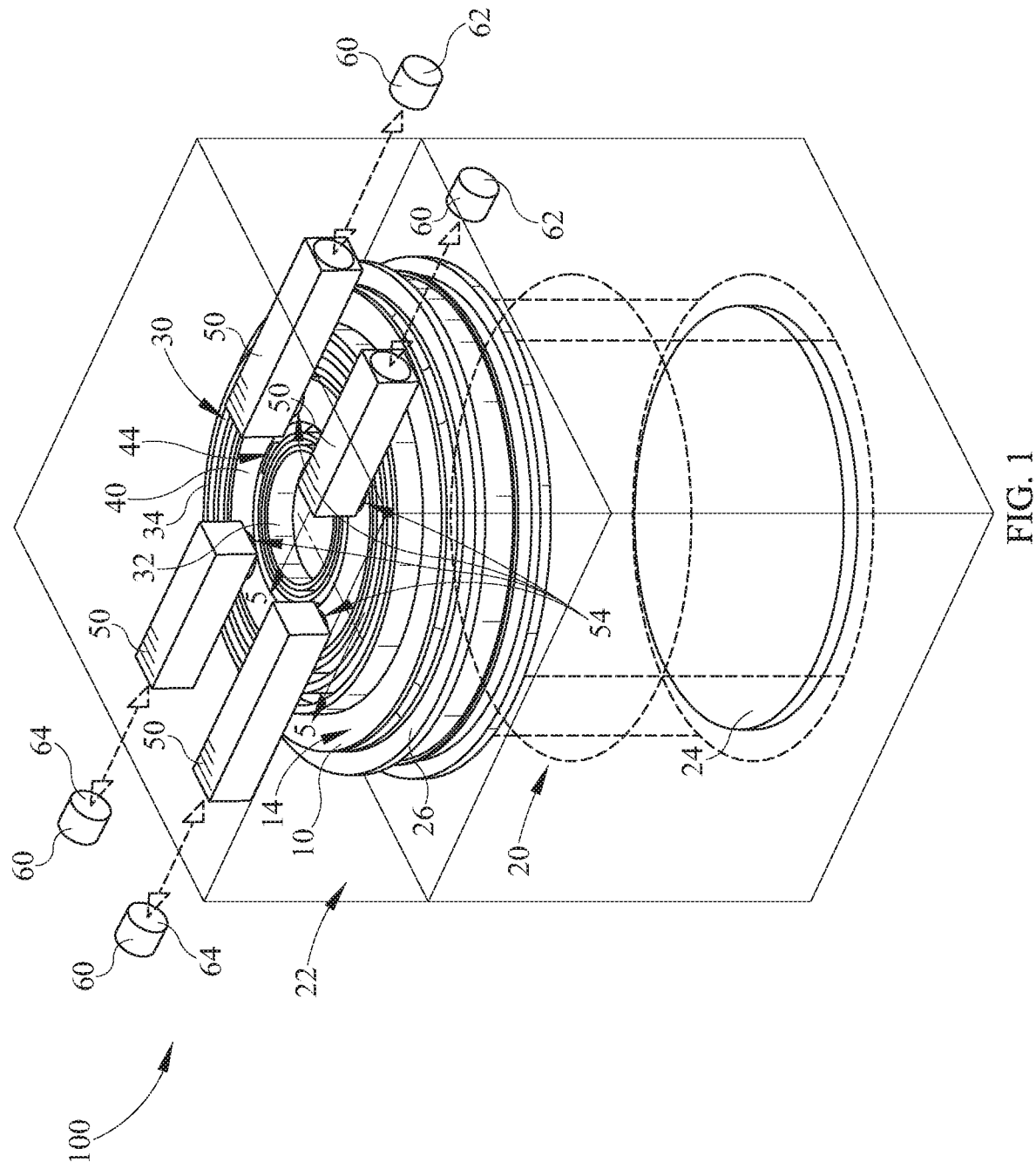
FIG. 1 schematically depicts a plasma processing device according to one or more embodiments shown and described herein.

FIG. 1 generally depicts one embodiment of a plasma processing device for etching materials from and/or depositing materials onto substrates. The plasma processing device generally comprises a vacuum chamber, a dielectric window sealing an opening in the vacuum chamber, an energy source, and at least one air amplifier. Various embodiments of the plasma processing device and the operation of the plasma processing device will be described in more detail herein.

Referring now to FIG. 1, the plasma processing device 100 comprises a vacuum chamber 20 for enclosing plasma processing gases and plasma during the processing of a substrate 24. The vacuum chamber 20 can be formed from a metallic material that can be set to a reference potential. A substrate 24 can be located within the vacuum chamber 20 for processing. For example, the substrate can be clamped in place with a chuck device (not depicted in FIG. 1). The vacuum chamber 20 can be maintained at a wide pressure range such as, for example, about 1-1000 mTorr, or about 100 MTorr to about 200 mTorr in embodiments for through silicon via etching. The vacuum chamber 20 can enclose plasma processing gases, which may comprise halogens or halogen elements such as, for example, fluorine (F), chlorine (Cl), bromine (Br), iodine (I), and astatine (At). Moreover, specific process gases may include $CClF_3$, $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, and other gases capable of being ionized.

The plasma processing device 100 comprises a dielectric window 10 through which electromagnetic energy can be transmitted. The dielectric window 10 comprises a plasma exposed surface 12 configured to be exposed to the interior of the vacuum chamber 20 and an air exposed surface 14. The dielectric window 10 is formed from a dielectric material that transmits electromagnetic energy such as, electromagnetic energy having a frequency range of 100 kHz to 100 MHz. Suitable dielectric materials include quartz and ceramics comprising, for example, Aluminum nitride (AlN), Aluminum oxide ($Al_2O_3$), or any other refractory material having similar transmissive properties.

The plasma processing device 100 comprises an energy source 30 for generating electromagnetic energy sufficient to ionize the plasma processing gases. The energy source 30 can include an inner coil 32 and an outer coil 34. Each of the inner coil 32 and the outer coil 34 is depicted in FIG. 1 as being formed from a continuous substantially rectangular shaped conductor having radially concentric and substantially circular spirals. It is noted that the energy source 30 can include coils formed in any shape suitable to generate electromagnetic energy such as, for example, faceted concentric segments concentric segments that are formed at angular turns with respect to one another, solenoid shaped conductors, toroid shaped conductors or combinations thereof.

The energy source 30 can be capable of generating electromagnetic energy over a wide range of powers such as, for example in some embodiments about 50 W to about 20 kW, in one embodiment greater than about 2 kW, in another embodiment about 3 kW, or in yet another embodiment about 4.5 kW. In some embodiments, the inner coil 32 and the outer coil 34 are conductively coupled with one another. In other embodiments multiple coils can be powered by multiple RF generators. It is noted that, while the energy source 30 is depicted as a multi-coiled RF source, the energy source can be any device capable of generating electromagnetic energy to generate an inductively coupled plasma such as, but not limited to, a radio frequency (RF) source, electron cyclotron resonance (ECR), a microwave horn, slotted antennae, or helicon sources, which use a spiral antenna wrapped around a cylindrical window.

Figure 2:
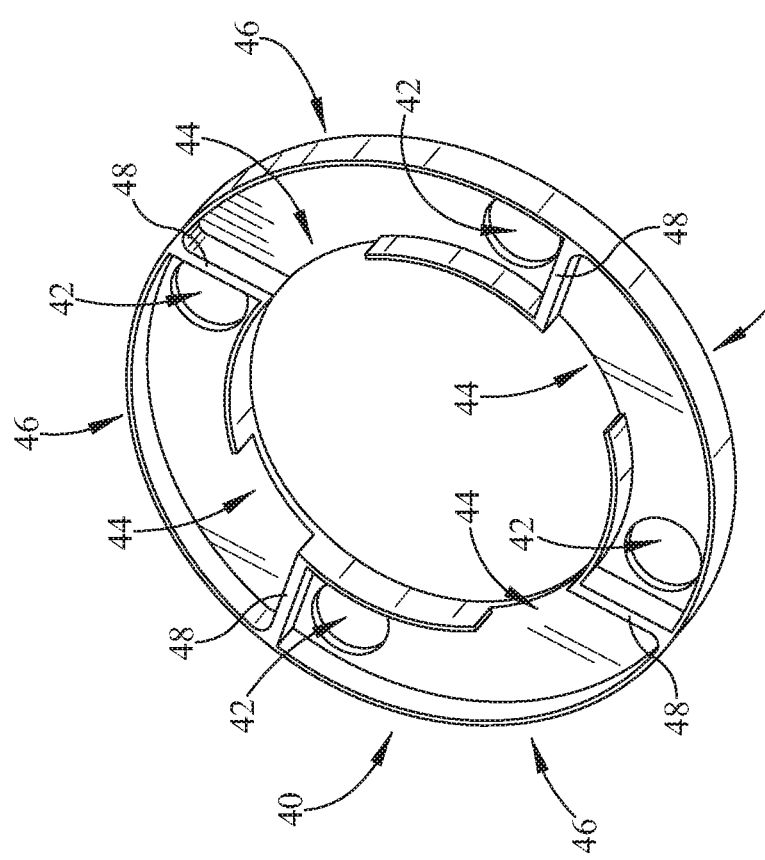
FIG. 2 schematically depicts a plenum according to one or more embodiments shown and described herein.

Referring collectively to FIGS. 1 and 2, the plasma processing device 100 may optionally comprise a plenum 40 for directing a substantially uniform flow of cooling air over the dielectric window 10. The plenum 40 is formed into a partial enclosure and comprises one or more inlets 42 and one or more outlets 44. Accordingly, cooling air can be received by an inlet 42 of the plenum 40 and introduced into a pressure region having a back pressure that is at least partially surrounded by the plenum 40. The plenum 40 can be divided into a plurality of segments 46 by partition walls 48, such that each segment comprises at least one inlet 42 and at least one outlet 44. It is noted that, while the plenum 40 is depicted as being substantially ring shaped in FIGS. 1 and 2, the plenum 40 can be formed into any shape suitable to provide cooling air to a heated region of the dielectric window 10, as is described in greater detail herein. The plenum 40 can be formed from passive material such as, for example, polytetrafluoroethylene (PTFE or "teflon"), polyether ether ketone (PEEK), polyetherimide (PEI or "ultem"), ceramics, or any other electromagnetic energy transmissive material.

Figure 3:
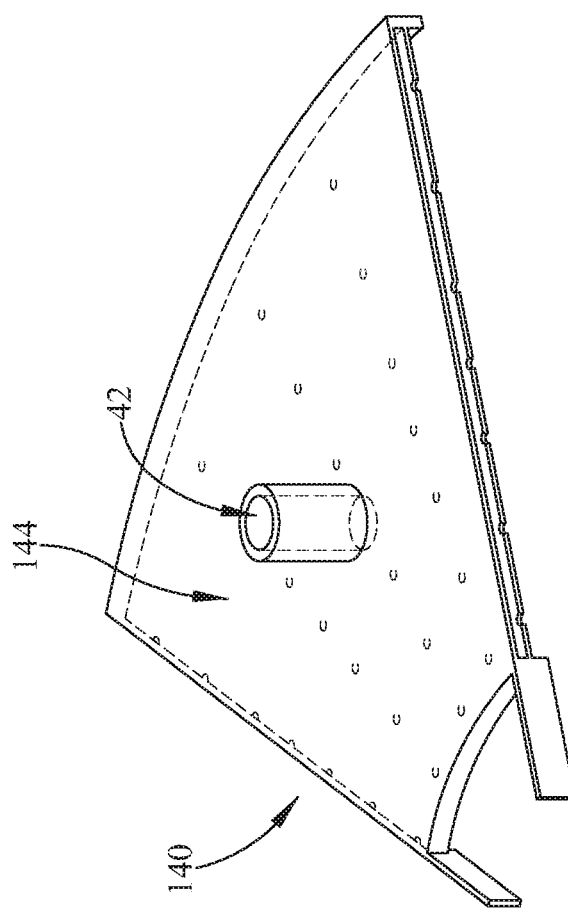
FIG. 3 schematically depicts a plenum segment according to one or more embodiments shown and described herein.

The plenum 40 can be formed as a single piece or as multiple segments that can be united with one another. Specifically, as depicted in FIG. 3, a plenum segment 140 may include a plurality of outlets 144 formed in the plenum segment 140. The plenum segment 140 may be substantially wedge-shaped and configured to combine with additional plenum segments 140 to enclose a substantially cylindrically shaped region or a substantially ring shaped region. It is noted, that the plenums described herein can be provided in any shape suitable to cooperate with the energy source 30 and provide pressurized cooling flow to the dielectric window 10 or a desired region thereof.

Figure 4:
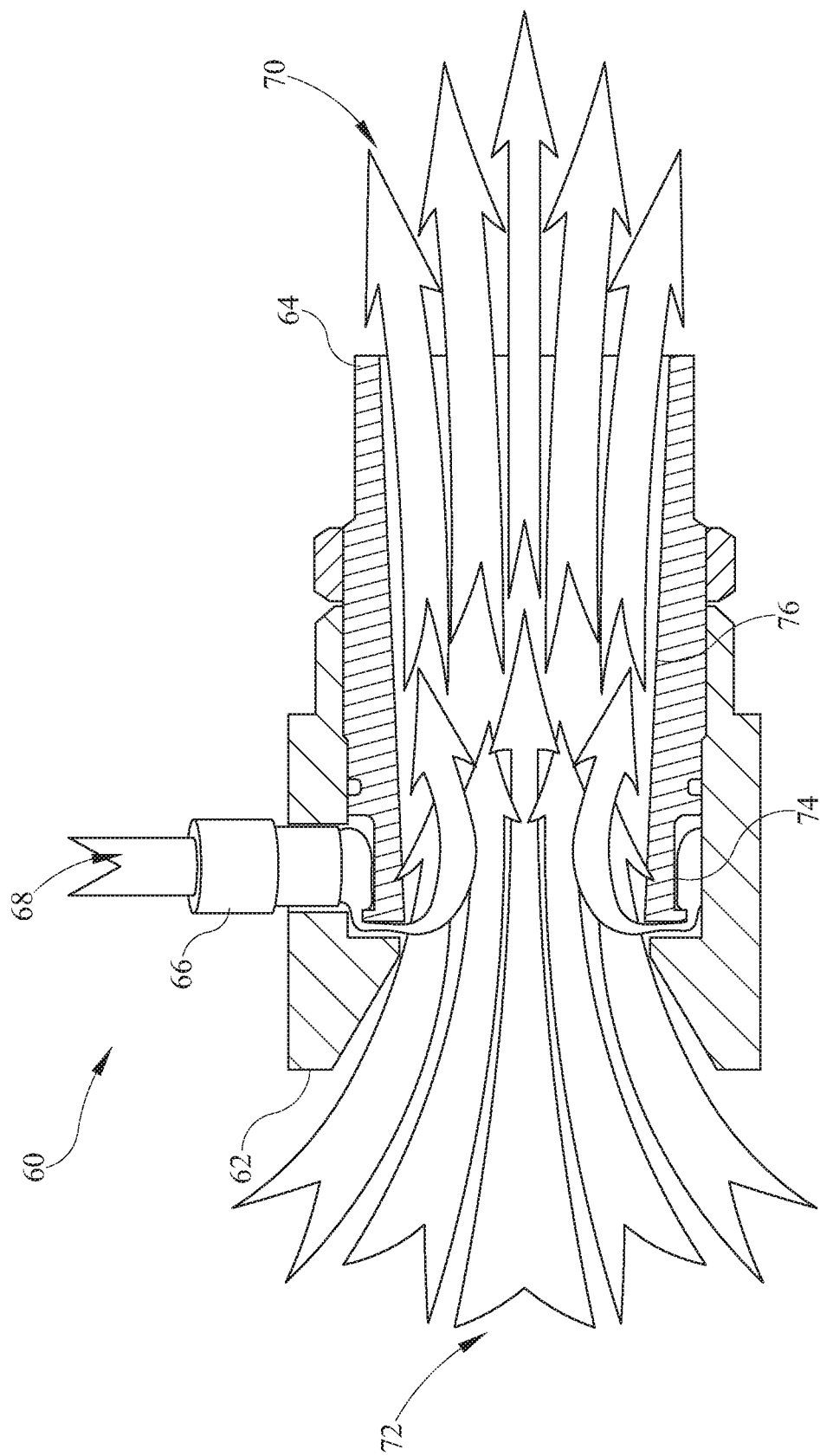
FIG. 4 schematically depicts an air amplifier according to one or more embodiments shown and described herein.

Referring now to FIG. 4, plasma processing device 100 comprises at least one air amplifier 60 for providing air to the plenum 40 (FIG. 1). Each air amplifier 60 comprises an inlet 62 for receiving input air 72, an exhaust 64 for outputting cooling air 70 and a control input 66 for receiving pressurized air 68 (e.g., clean dry air). Without being bound to any specific theory, it is believed that pressurized air 68 injected into the control input 66 provides a relatively large amount of cooling air 70, as compared to the pressurized air 68, in accordance with Bernoulli's principle and the Coanda effect. Specifically, the pressurized air 68 can be injected through the control input 66 and into ring shaped nozzle 74. The pressurized air 68 can travel through the ring shaped nozzle 74 and enter the air amplifier 60 at a relatively high velocity compared to the air outside of the air amplifier 60. The pressurized air 68 can be directed towards the exhaust 64 of the air amplifier 60. In accordance with the Coanda effect, the pressurized air 68 may travel substantially along the annular boundary 76 of the air amplifier 60.

The pressurized air 68 can entrain the surrounding air and generate a relatively low pressure region compared to the air surrounding the inlet 62 of the air amplifier 60. The pressurized air 68 may cause input air 72 to be pulled into the air amplifier 60 due to entrainment, the pressure differential, or a combination thereof. Accordingly, the air amplifier 60 can generate a relatively high amount of cooling air 70 with respect to the pressurized air 68. Thus, the air amplifier 60 can provide suitable air flow when supplied with pressurized air 68 having a pressure from about 20 psig to about 100 psig such as, for example, in one embodiment about 25 psig to about 80 psig, in another embodiment about 30 psig, or in another embodiment about 50 psig. The air amplifier 60 can provide suitable amounts of cooling air 70 at a rate of at least about 20 cfm such as, for example, in one embodiment about 20 cfm to about 3,000 cfm, in another embodiment about 25 cfm to about 900 cfm, in yet another embodiment about 30 cfm to about 230 cfm or in a further embodiment about 125 cfm to about 230 cfm.

Referring back to FIG. 1, in one embodiment of the plasma processing device 100, the vacuum chamber 20 can be coupled to the dielectric window 10. For example, an opening of the vacuum chamber 20 can be sealed at least in part by the dielectric window 10. Specifically, the plasma exposed surface 12 of the dielectric window 10 can be exposed to plasma and/or plasma processing gases during the operation of the plasma processing device 100. It is noted that, while the dielectric window 10 is depicted in FIG. 1 as being coupled to the top of the vacuum chamber 20, the dielectric window 10 may seal any portion of the vacuum chamber 20 suitable to receive electromagnetic energy. In some embodiments, the plasma processing device 100 may include a heater 26 for heating portions of the dielectric window 10 and reducing stresses within the dielectric window 10.

Figure 5B:
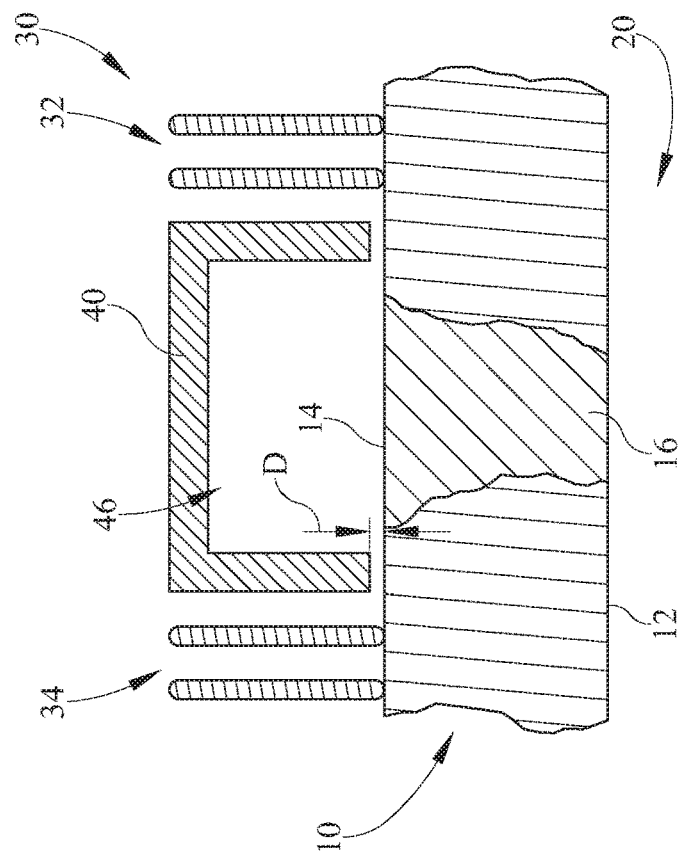
FIG. 5B schematically depicts a cross sectional view taken along line 5-5 of FIG. 1 according to one or more embodiments shown and described herein.
Figure 5A:
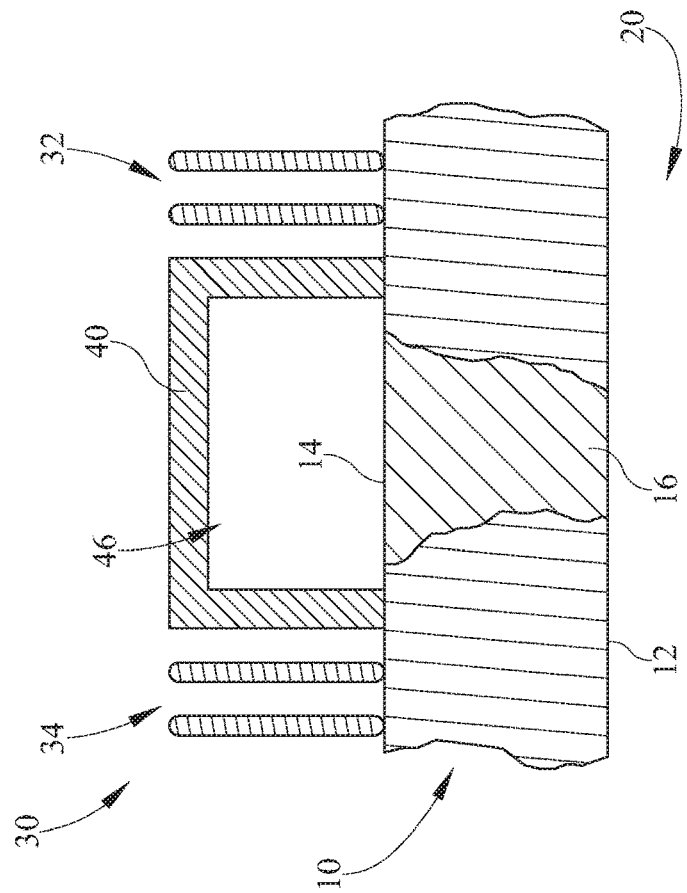
FIG. 5A schematically depicts a cross sectional view taken along line 5-5 of FIG. 1 according to one or more embodiments shown and described herein.

The energy source 30 can be disposed outside of the vacuum chamber 20 and adjacent to the dielectric window 10. A plenum 40 can be located adjacent to the energy source 30 and the dielectric window 10 such that the plenum 40 is in fluid communication with the air exposed surface 14 of the dielectric window 10. Referring collectively to FIGS. 5A and 5B, the plenum 40 can be located between the inner coil 32 and the outer coil 34. In one embodiment, depicted in FIG. 5A, a portion of the plenum 40 can contact the air exposed surface 14 of the dielectric window 10. In another embodiment, depicted in FIG. 5B, the plenum 40 can be offset from the air exposed surface 14 of the dielectric window 10 by an offset distance D. The offset distance D can be any distance suitable to promote effective cooling of the dielectric window 10 such as, for example, in one embodiment greater than about 0.25 mm, or in another embodiment about 2 mm.

During operation, the energy source 30 transmits electromagnetic energy through the dielectric window 10 and into the vacuum chamber 20 to transform at least a portion of the plasma processing gas into plasma. A portion of the electromagnetic energy is transformed into heat energy that can be absorbed by the dielectric window 10. Specifically, some electromagnetic energy can be converted into heat according to the dielectric properties of the dielectric window 10 and a further portion of the electromagnetic energy can be absorbed by the dielectric window 10 after it ionizes the plasma processing gases (e.g., the dielectric window 10 can be heated by the plasma via plasma exposed surface 12). Accordingly, the temperature of the dielectric window 10 can be increased by the electromagnetic energy. In some embodiments, the electromagnetic energy is anisotropic such that different portions of the dielectric window 10 are subjected to varying amounts of electromagnetic energy. It is believed that the heat induced in the dielectric window 10 can be correlated with the amount of electromagnetic energy transmitted through the dielectric window 10. For example, in the embodiments described herein greater than about 40% of the electromagnetic energy can be absorbed as heat by the dielectric window 10. The dielectric window can absorb at least about 0.4 kW of electromagnetic energy as heat such as, for example, in one embodiment greater than about 1 kW, in another embodiment about 1.5 kW, or in yet another embodiment about 2.25 kW. Accordingly, an elevated temperature region 16 (hot spot) can be formed in the portion of the dielectric window 10 that is subjected to a relatively high amount of heat induced by the electromagnetic energy with respect to the other portions of the dielectric window 10.

The plenum 40 can be disposed over the elevated temperature region 16 of the dielectric window 10. The elevated temperature region 16 can include any region of the dielectric window 10 having a temperature during processing that exceeds the average temperature of the dielectric window 10 while plasma is generated within the vacuum chamber 20. The elevated temperature region 16 may include the portion of the dielectric window 10 having the peak temperature during operation. Alternatively or additionally, the elevated temperature region 16 may include the portion of the dielectric window 10 having the highest average temperature. In embodiments comprising an inner coil 32 and an outer coil 34, the elevated temperature region 16 may be located in portion of the dielectric window 10 located immediately beneath the gap between the inner coil 32 and the outer coil 34. In embodiments without a plenum, the at least one air amplifier 60 (FIG. 4) can be in direct fluid communication with the elevated temperature region 16 of the dielectric window 10.

Referring back to FIG. 1, at least one air amplifier 60 is in fluid communication with the plenum 40. Specifically, the plasma processing device 100 can have one or more ducts 50. The one or more ducts 50 can be formed from passive material such as, for example, teflon, PEEK, ultem, ceramics, or any other electromagnetic energy transmissive material. Each duct 50 may include an amplifier orifice 52 in fluid communication with the exhaust 64 of an air amplifier 60 and a plenum orifice 54 in fluid communication with an inlet 42 of the plenum 40. Accordingly, the air amplifier 60 can supply cooling air to the dielectric window 10 via a duct 50 and plenum 40. It is noted that, while FIG. 1 depicts four air amplifiers 60 and four ducts 50, the plasma processing device 100 can have any number of air amplifiers 60 and ducts 50 sufficient to provide adequate cooling to the dielectric window 10.

Air supplied to the plenum 40 can be purged passively. For example, the plenum 40 can be housed within a pressure controlled chamber 22. The pressure controlled chamber 22 can be maintained at a pressure that is lower than ambient pressure and the outlet 44 of the plenum 40 can purge air directly into the pressure controlled chamber 22. The purged air can be removed from the pressure controlled chamber 22 via an exhaust system (not depicted in FIG. 1). In another embodiment, the pressure controlled chamber 22 can be maintained at a pressure that is higher than ambient pressure and the outlet 44 of the plenum 40 can purge air directly into the pressure controlled chamber 22. The purged air can be removed from the pressure controlled chamber 22 via vents (not depicted in FIG. 1). In further embodiments, the plenum can be in fluid communication with exhaust ducting (not depicted in FIG. 1) to passively purge air outside of the plasma processing device 100.

Additionally or alternatively, air can be actively purged from the plenum 40. For example, one or more air amplifiers 60 can be in fluid communication with the plenum 40 and configured to remove air from the plenum 40. Accordingly, while FIG. 1 depicts the ducts 50 in an input only arrangement, the ducts 50 can be configured to provide air and/or remove air from the plenum 40. Moreover, while FIG. 1 depicts the air amplifiers 60 as providing air to the plenum 40, the inlet 62 of an air amplifier 60 can be in communication with the outlet 44 of the plenum 40 to remove air from the plenum 40.

Figure 6B:
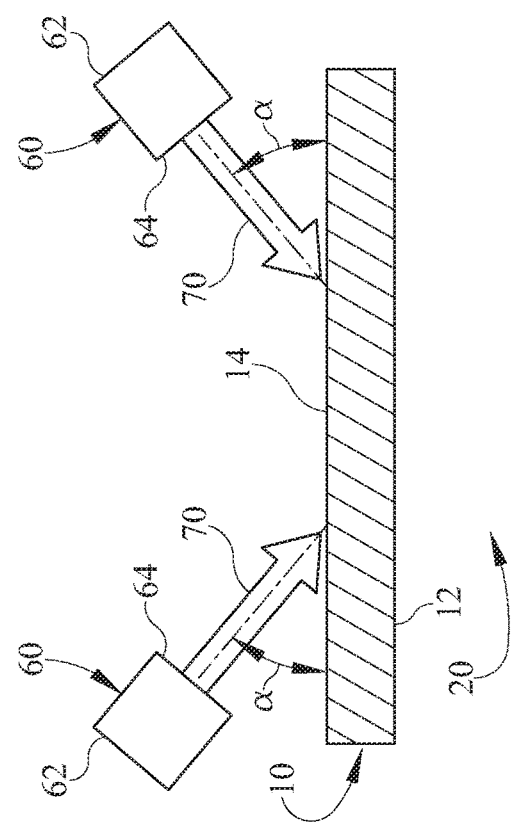
FIG. 6B schematically depicts a dielectric window according to one or more embodiments shown and described herein.
Figure 6A:
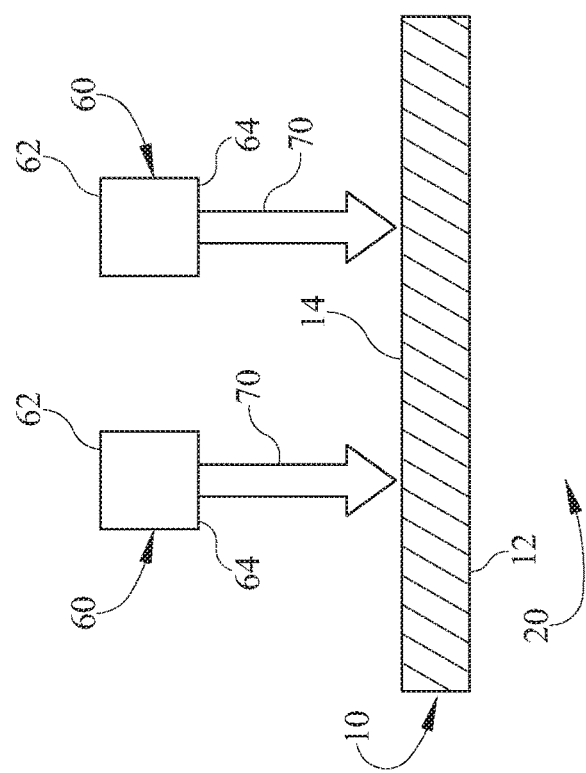
FIG. 6A schematically depicts a dielectric window according to one or more embodiments shown and described herein.

In some embodiments, at least one air amplifier can be used without a plenum. For example, referring collectively to FIGS. 6A and 6B, the at least one air amplifier 60 can be in fluid communication with the air exposed surface 14 of the dielectric window 10 without the use of a plenum. Specifically, FIG. 6A schematically depicts one embodiment where the at least one air amplifier 60 is oriented perpendicularly with respect to the air exposed surface 14 of the dielectric window 10. Accordingly, the exhaust 64 of the at least one air amplifier 60 can be oriented with respect to the dielectric window 10, such that the cooling air 70 flows along a path that is substantially perpendicular to the air exposed surface 14 of the dielectric window 10. In another embodiment, depicted in FIG. 6B, the at least one air amplifier 60 is oriented at an oblique angle α with respect to the air exposed surface 14 of the dielectric window 10. Accordingly, the exhaust 64 of the at least one air amplifier 60 can be oriented with respect to the dielectric window 10, such that the cooling air 70 flows along a path that is aligned with the air exposed surface 14 of the dielectric window 10 at an oblique angle α. It is noted that, while the oblique angle α is depicted in FIG. 6B as being from about 25° to about 35°, the oblique angle α can be any angle suitable to control to temperature of the dielectric window 10.

As is noted above, the injection of cooling flow with at least one air amplifier 60 can generate substantial amounts of back pressure, which can inhibit the flow of air towards the dielectric window 10. According to the embodiments described herein, the plenum 40 generally is pressurized to a back pressure of at least about 1 in-H$_2$O such as, for example, in one embodiment greater than about 2 in-H$_2$O. Furthermore, it is noted that back pressure is not required for the operation of air amplifiers 60.

For example, a self-consistent air flow and energy conservation multi-physics model was utilize to calculate the correlation between the air output provided per air amplifier and the back pressure in the plenum. The model included four air amplifiers which supplied cooling air via ducts to a single plenum. The results were determined using an offset plenum and a flush plenum. The results from the model are summarized below in Table 1.

TABLE 1

| Plenum Spacing (mm) | air per air amplifier (cfm) | Back Pressure (in-H$_2$O) |
|---|---|---|
| flush | 30 | 4.475 |
| flush | 30 | 4.068 |
| flush | 90 | 38.64 |
| flush | 90 | 33.36 |
| flush | 125 | 72.4 |
| flush | 125 | 62.65 |
| 2 | 30 | 2.85 |
| 2 | 30 | 2.44 |

The model results indicate the plenum is pressurized to a back pressure of at least about 2.4 in-H$_2$O for an output of 30 cfm per air amplifier. Moreover, the model results demonstrate that, generally, back pressure and air flow are correlated. Specifically, with an increase in output flow from the air amplifier the back pressure (flow resistance) offered by the plenum increases.

It should now be understood that air amplifiers can be utilized with a variety of air channeling plenum designs to control the temperature of dielectric windows. Moreover, the model data indicates that air amplifiers are capable of providing relatively high rates of cooling air to dielectric windows with the aid of plenums even when subjected to back pressures sufficient to stall fan cooling systems. Accordingly, the embodiments described herein may be utilized to effectively cool dielectric windows that are subjected to electromagnetic energy in excess of about 3 kW such as, for through silicon via etching processes. Moreover, the embodiments described herein may be utilized to effectively cool dielectric windows that are subjected to other types of electromagnetic energy such as, for etch processes, chemical vapor deposition, oxide etching, metal etching, and the like.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:
1. A plasma processing device comprising:
a dielectric window comprising a plasma exposed surface and an air exposed surface;
a vacuum chamber coupled with the dielectric window, wherein the vacuum chamber and the plasma exposed surface of the dielectric window cooperate to enclose a plasma processing gas;
an energy source disposed adjacent to the dielectric window, wherein the energy source transmits electromagnetic energy through the dielectric window and into the vacuum chamber such that the electromagnetic energy forms an elevated temperature region in the dielectric window and transforms at least a portion of the plasma processing gas into a plasma; and at least one air amplifier in fluid communication with the air exposed surface of the dielectric window, wherein the at least one air amplifier outputs at least about 20 cfm of air; and a plenum in fluid communication with the air exposed surface of the dielectric window and the at least one air amplifier to receive cooling air from the at least one air amplifier, wherein the plenum is divided into a plurality of substantially wedge-shaped segments by partition walls that are shared by adjacent segments and each segment comprises at least one inlet and at least one outlet that outputs air directly into a pressure region partially surrounded by the plenum, wherein the at least one air amplifier is external to the plenum.

2. The plasma processing device of claim 1, wherein the plenum is configured to combine with another plenum to enclose a substantially cylindrically shaped region or a substantially ring shaped region.

3. The plasma processing device of claim 1, wherein the at least one air amplifier outputs at least about 30 cfm of air and the plenum is pressurized to a back pressure of at least about 1 in-$H_2O$.

4. The plasma processing device of claim 1, wherein the plenum is disposed over the elevated temperature region of the dielectric window.

5. The plasma processing device of claim 1, wherein the at least one air amplifier comprises a control input in fluid communication with a ring shaped nozzle.

6. The plasma processing device of claim 1, wherein the plenum is located within a pressure controlled enclosure and air is purged from at least one outlet of the plenum to the pressure controlled enclosure.

7. The plasma processing device of claim 1, wherein the energy source comprises an inner coil and an outer coil.

8. The plasma processing device of claim 7, wherein the plenum is disposed between the inner coil and the outer coil.

9. The plasma processing device of claim 1, wherein the plenum is substantially ring shaped.

10. The plasma processing device of claim 4, wherein the plenum is in contact with the dielectric window.

11. The plasma processing device of claim 4, wherein the plenum is offset from the dielectric window.

12. A plasma processing device comprising:
a dielectric window comprising a plasma exposed surface and an air exposed surface;
a vacuum chamber coupled with the dielectric window, wherein the vacuum chamber and the plasma exposed surface of the dielectric window cooperate to enclose a plasma processing gas;
an energy source disposed adjacent to the dielectric window, wherein the energy source transmits electromagnetic energy through the dielectric window and into the vacuum chamber such that the electromagnetic energy forms an elevated temperature region in the dielectric window and transforms at least a portion of the plasma processing gas into a plasma; and
at least one air amplifier in fluid communication with the air exposed surface of the dielectric window, wherein the at least one air amplifier comprises a first inlet for receiving pressurized air at a first velocity and a first volume, a second inlet for receiving ambient air at a second velocity, and an exhaust for outputting amplified air at a second volume, wherein the first velocity is greater than the second velocity and the first volume is less than the second volume; and
a plenum in fluid communication with the air exposed surface of the dielectric window and the at least one air amplifier to receive cooling air from the at least one air amplifier, wherein the plenum is divided into a plurality of substantially wedge-shaped segments by partition walls that are shared by adjacent segments and each segment comprises at least one inlet and at least one outlet that outputs air directly into a pressure region partially surrounded by the plenum, wherein the at least one air amplifier is external to the plenum.

13. The plasma processing device of claim 12, wherein the plenum is configured to combine with another plenum to enclose a substantially cylindrically shaped region or a substantially ring shaped region.

14. The plasma processing device of claim 12, wherein the at least one air amplifier outputs at least about 30 cfm of air and the plenum is pressurized to a back pressure of at least about 1 in-$H_2O$.

15. The plasma processing device of claim 12, wherein the plenum is substantially ring shaped.

16. The plasma processing device of claim 12, wherein the plenum is disposed over the elevated temperature region of the dielectric window.

17. A plasma processing device comprising:
a dielectric window comprising a plasma exposed surface and an air exposed surface;
a vacuum chamber coupled with the dielectric window, wherein the vacuum chamber and the plasma exposed surface of the dielectric window cooperate to enclose a plasma processing gas;
an energy source disposed adjacent to the dielectric window, wherein the energy source transmits electromagnetic energy through the dielectric window and into the vacuum chamber such that the electromagnetic energy forms an elevated temperature region in the dielectric window and transforms at least a portion of the plasma processing gas into a plasma; and
at least one air amplifier in fluid communication with the air exposed surface of the dielectric window, wherein the at least one air amplifier comprises a first inlet for receiving pressurized air at a first velocity and a first volume, a second inlet for receiving ambient air at a second velocity, and an exhaust for outputting amplified air at a second volume, wherein the first velocity is greater than the second velocity and the first volume is less than the second volume; and
a substantially annular plenum in fluid communication with the air exposed surface of the dielectric window and the at least one air amplifier to receive cooling air from the at least one air amplifier, wherein the plenum is divided into a plurality of segments by partition walls that are shared by adjacent segments and each segment comprises at least one inlet and at least one outlet that outputs air directly into a pressure region partially surrounded by the plenum, wherein at least one of the segments is substantially wedge-shaped and wherein the at least one air amplifier is external to the plenum.

18. The plasma processing device of claim 17, wherein the plenum is configured to combine with another plenum to enclose a substantially cylindrically shaped region or a substantially ring shaped region.

19. The plasma processing device of claim 17, wherein the at least one air amplifier outputs at least about 20 cfm of air and the plenum is pressurized to a back pressure of at least about 1 in-$H_2O$.

* * * * *